United States Patent
Robertson et al.

(10) Patent No.: US 10,291,001 B2
(45) Date of Patent: May 14, 2019

(54) RACK-MOUNT CHASSIS

(71) Applicant: Digital Alert Systems, Inc., Lyndonville, NY (US)

(72) Inventors: William Guy Robertson, Bradenton, FL (US); Daniel Lawrence Bernard, Gasport, NY (US)

(73) Assignee: Digital Alert Systems, Inc., Lyndonville, NY (US)

( * ) Notice: Subject to any disclaimer, the term of this patent is extended or adjusted under 35 U.S.C. 154(b) by 0 days.

(21) Appl. No.: 15/958,094

(22) Filed: Apr. 20, 2018

(65) Prior Publication Data

US 2019/0052066 A1 Feb. 14, 2019

Related U.S. Application Data

(60) Provisional application No. 62/543,158, filed on Aug. 9, 2017.

(51) Int. Cl.
| | |
|---|---|
| *G06F 1/16* | (2006.01) |
| *H05K 5/00* | (2006.01) |
| *H05K 7/00* | (2006.01) |
| *H02B 1/36* | (2006.01) |
| *H02B 1/20* | (2006.01) |

(52) U.S. Cl.
CPC ............... *H02B 1/36* (2013.01); *H02B 1/20* (2013.01)

(58) Field of Classification Search
CPC .......... H02B 1/36; H02B 1/20; H05K 5/0226; H05K 5/0017; H05K 5/0204; H05K 5/0217; H05K 5/0221; H05K 5/0234

USPC ...... 361/679.01, 724–727; 312/223.1, 223.2, 312/223.3
See application file for complete search history.

(56) References Cited

U.S. PATENT DOCUMENTS

| | | | | |
|---|---|---|---|---|
| 6,653,802 B1* | 11/2003 | Nelson | ................... | H05B 39/00 315/291 |
| 6,944,383 B1* | 9/2005 | Herzog | ................ | G02B 6/4455 174/50 |
| 7,646,590 B1* | 1/2010 | Corhodzic | ........... | H05K 7/1492 361/622 |
| 8,369,092 B2* | 2/2013 | Atkins | ..................... | G06F 1/187 361/727 |
| 8,599,550 B2* | 12/2013 | Davis | ................... | G11B 33/128 361/679.33 |
| 9,232,678 B2* | 1/2016 | Bailey | ................. | H05K 7/1489 |
| 10,039,206 B1* | 7/2018 | Wishman | ............. | H05K 7/1492 |
| 2002/0118514 A1* | 8/2002 | Coglitore | .................. | G06F 1/18 361/724 |

(Continued)

*Primary Examiner* — Anthony M Haughton
(74) *Attorney, Agent, or Firm* — Heslin Rothenberg Farley & Mesiti, P.C.

(57) ABSTRACT

Rack-mount chassis for mounting to an electronic equipment rack are disclosed. A rack-mount chassis may include a housing comprising a top portion, a bottom portion, a first side portion, a second side portion and a back portion. The rack-mount chassis may further include a front portion forming a front face of the housing. The rack-mount chassis may also include at least one electronic component within the housing. The rack-mount chassis may further include at least one electrical power coupler mounted to at least one recessed portion of the first side portion of the housing configured to mate with a corresponding connector plug of a power cord and supply electrical power therefrom to the at least one electronic component.

22 Claims, 18 Drawing Sheets

(56) References Cited

U.S. PATENT DOCUMENTS

| | | | | |
|---|---|---|---|---|
| 2003/0002261 A1* | 1/2003 | Berry | ............... | H05K 7/1489 |
| | | | | 361/727 |
| 2008/0144293 A1* | 6/2008 | Aksamit | ............ | H05K 7/1489 |
| | | | | 361/727 |
| 2010/0172087 A1* | 7/2010 | Jeffery | ............... | G11B 33/02 |
| | | | | 361/679.33 |
| 2012/0069514 A1* | 3/2012 | Ross | ............... | H05K 7/20727 |
| | | | | 361/679.33 |
| 2013/0003317 A1* | 1/2013 | Gong | ............... | H01R 13/72 |
| | | | | 361/726 |

* cited by examiner

RACK-MOUNT CHASSIS

CROSS-REFERENCE TO RELATED APPLICATION

This application perfects and claims the benefit of U.S. Provisional Patent Application No. 62/543,158, filed on Aug. 9, 2017, and entitled Rack-Mount Chassis, which is hereby expressively incorporated herein by reference in its entirety.

TECHNICAL FIELD

The present application is generally directed to rack-mount chassis, instruments and/or systems. More particularly, the present application is directed to rack-mount chassis that include an electrical power coupler on a recessed side portion thereof.

BACKGROUND

Electronic components are commonly manufactured in component form. These electronic components are commonly interconnected and housed in a chassis or housing to form an electronic instrument, device or system. Some electronic chassis are of standardized shapes and/or sizes, and include attachment mechanisms that enable the chassis to couple with pre-existing corresponding electronic equipment racks. Electronic equipment that is designed to be housed within an electronic equipment rack is typically described as a "rack-mount," a "rack mounted system/instrument," a "rack-mount chassis," a "subrack," "rack mountable" or, occasionally, simply a "shelf" These terms are used interchangeable herein. The height of some rack-mount chassis (such as the front portion or face thereof) is standardized as multiples of about 1.75 inches, commonly referred to as one rack unit or "U." Such rack-mount chassis may be 1 U, 2 U, 3 U or other rack unit heights. Similarly, the width of some rack-mount chassis is standardized based on the width of pre-existing electronic equipment racks. However, some rack-mount chassis are not standardized, but may be configured to mount to one or more pre-determined or corresponding electronic equipment racks.

Electronic equipment racks are also referred to as "electronic rack enclosures," "rack enclosures," "rack cabinets" or simply "racks." These terms are used interchangeable herein. Electronic equipment racks allow users of electronic equipment to readily store, organize and access the chassis/electronic components and interconnect the components with appropriate electronic connections. Thereby, electronic equipment racks serve as means of organizing, storing and protecting valuable electronic components and rack-mount chassis. Typical racks are rectangular in shape and made from relatively strong materials. Some racks are of standardized heights, depths and/or widths. For example, some standardized racks include about a 19 inch width, or about a 23 inch or 600 mm width. Similarly, some standardized racks include a 42 U or 46 U height (commonly referred to as a "full" or "full size" rack) or an 18 U-22 U height (commonly referred to as a "half" or "half size" rack). However, as noted above, non-standardized racks also exist.

Many electronic equipment racks are available with either two front posts or rails (typically vertically extending) or four posts (two front posts and two back posts). Some racks have mounting rails or slides to support mount-rack chassis at both their front and rear portions. Many mount-rack chassis, however, mount to at least the two front posts of the racks via mounting holes in at least the front posts of the racks via associated hardware. For example, some rack-mountable equipment may be mounted simply by bolting or otherwise attaching or fastening at least the front panel thereof to the front posts of a rack. The mounting-hole distance or spacing within the rack posts may differ from rack to rack, and may differ between different standard sized racks. For example, some racks include even mounting-hole spacing, while other racks utilize an uneven mounting-hole spacing.

Some rack mount enclosures lack side panels or walls, a back panel or wall and/or a front panel or access door. However, some typical racks have solid or mesh/porous side panels. Similarly, some typical racks have either open, openable or mesh/porous front and/or back panels. If a particular rack includes a back wall or panel, it is typically removable or openable to expose the back portion of the rack-mount chassis mounted therein.

Rack-mount chassis and corresponding rack enclosures are widely used for computing, server and network equipment, allowing for dense hardware configurations without occupying excessive floor space or requiring shelving. Rack-mount chassis and corresponding racks are also commonly used with industrial power, control, automation, telecommunication, audio, video, entertainment, testing and laboratory electronics, for example. Many other electronic equipment or configurations are (or can be) housed within a rack-mount chassis and mounted within a corresponding rack. Simply stated, a rack-mount chassis and a corresponding rack enclosure may be used to house, store and operate any electronic equipment configured for any purpose or function.

Regardless of the particular electronic component(s) that is/are installed within a rack-mount chassis (and its/their particular configuration), essentially all electronic components depend on the passage of electric current to perform their intended function. Currently, electrical power is supplied or provided to a rack-mount chassis to power the electronic component(s) thereof via at least one power cord that mechanical and electrically couples to a corresponding electrical power coupler provided in the back end or portion of the chassis. The electrical power coupler of current rack-mount chassis is thereby typically accessed via the back of the chassis. In this way, one or more power cords commonly extend into the rear or back portion of an electronic equipment rack to couple to the power coupler at the back portion of one or more rack-mount chassis mounted within the rack. However, some rack-mount chassis require, or would benefit from, a relatively large number of input and/or output connectors or connections (i.e., electrical connections or ports) at the back portion or panel of the chassis (or other mechanisms, such as visual displays, access panels, etc.). As discussed above, many rack-mount chassis are configured according to standardized sizes, shapes and configurations to cooperate with corresponding standardized and/or pre-existing racks. The size, shape and configuration of the back portion or end of standardized rack-mount chassis is thereby limited and pre-determined or pre-defined. As such, the back portion or end of many rack-mount chassis cannot be physically enlarged or redesigned to accommodate or include more input and/or output connectors or other non-power coupler mechanisms than its standardized size, shape and configuration allows for or dictates.

For these reasons, and for other reasons discussed below and/or which will become apparent to those skilled in the art upon reading and understanding the present disclosure, there is a need in the art for a rack-mount chassis that include at least one electrical power coupler or input on a side portion of the chassis. Further, rack-mount chassis that include a back portion or end that is void of an electrical power coupler, which may instead be provided on a side portion of the chassis, are desirable.

SUMMARY

In one aspect, the present disclosure provides a rack-mount chassis for mounting to an electronic equipment rack. The rack-mount chassis includes a housing comprising a top portion, a bottom portion, a first side portion, a second side portion and a back portion. The rack-mount chassis also includes a front panel forming a front face of the housing including portions that protrude past the first and second side portions for coupling to front posts of the electronic equipment rack with the housing positioned within the rack. The rack-mount chassis further includes at least one electronic component within the housing. The rack-mount chassis also includes at least one electrical power coupler mounted to at least one recessed portion of the first side portion of the housing configured to mate with a corresponding connector plug of a power cord and supply electrical power therefrom to the at least one electronic component.

In some embodiments, the rack-mount chassis further includes at least one internal power unit positioned within the housing and electrically coupled between at least one coupler and at least one electronic component. In some embodiments, the at least one recessed portion and the at least one coupler are spaced from the back portion towards the front panel. In some embodiments, the at least one recessed portion and the at least one coupler are proximate to the front panel and distal to the back portion. In some embodiments, the first side portion extends between the top and bottom portions and the back portion and the front panel.

In some embodiments, the first side portion includes at least one support mechanism extending outwardly therefrom positioned between the back portion and the at least one coupler configured to route the power cord along the first side portion and past the back portion. In some such embodiments, the at least one support mechanism forms a channel with the first side portion that supports and prohibits movement the power cord. In some other such embodiments, the at least one support mechanism includes an outer portion that prevents the contact of the power cord with the electronic equipment rack.

In some embodiments, the rack-mount chassis further includes the power cord. In some embodiments, the at least one electrical power coupler extends through an aperture in the at least one recessed portion of the first side portion. In some embodiments, a plurality of electrical power supply mounted to at least one recessed portion of the first side portion of the housing. In some such embodiments, the plurality of electrical power couplers are mounted to a plurality of respective recessed portions of the first side portion of the housing.

In some embodiments, the rack-mount chassis further includes at least one electrical power coupler mounted to at least one recessed portion of the second side portion of the housing configured to mate with a corresponding connector plug of a power cord and supply electrical power therefrom to the at least one electronic component. In some such embodiments, a plurality of electrical power couplers are mounted to at least one recessed portion of the second side portion of the housing. In some such embodiments, a plurality of electrical power couplers are mounted to a plurality of respective recessed portions of the second side portion of the housing.

In some embodiments, the back portion of the housing is void of an electrical power coupler. In some embodiments, the back portion of the housing includes at least one input and/or output connector.

In another aspect, the present disclosure provides a rack-mount chassis for mounting to an electronic equipment rack. The rack-mount chassis includes a housing with a top portion, a bottom portion, a first side portion, a second side portion and a back portion. The housing is configured to house at least one electronic component. The rack-mount chassis also includes a front portion forming a front face of the housing. At least the first side portion of the housing includes at least one recessed portion configured to couple with at least one electrical power coupler.

In some embodiments, the rack-mount chassis further includes the at least one electrical power coupler. In some embodiments, the at least one electrical power coupler is configured to mate with a corresponding connector plug of a power cord to receive electrical power therefrom. In some embodiments, the rack-mount chassis further includes at least one electronic component within the housing configured to receive electrical power from the at least one electrical power coupler. In some embodiments, the rack-mount chassis further includes at least one internal power supply unit positioned within the housing and electrically coupled to the at least one electrical power coupler.

In some embodiments, the first side portion includes at least one support mechanism extending outwardly therefrom positioned between the back portion and the at least one recessed portion configured to route a power cord from the at least one recessed portion, along the first side portion and past the back portion. In some embodiments, the back portion of the housing is void of an electrical power coupler. In some embodiments, the at least one recessed portion of the first side portion includes at least one aperture extending therethrough configured to couple with the at least one electrical power coupler. In some embodiments, the front portion includes portions that protrude past the first and second side portions for coupling to front posts of the electronic equipment rack with the housing positioned within the rack.

These and other objects, features and advantages of this disclosure will become apparent from the following detailed description of the various aspects of the disclosure taken in conjunction with the accompanying drawings.

BRIEF DESCRIPTION OF THE DRAWINGS

For the purposes of illustrating the rack-mount chassis, systems and/or instruments, and related methods, described herein, there is shown herein illustrative embodiments. These illustrative embodiments are in no way limiting in terms of the precise arrangement and operation of the disclosed rack-mount chassis, systems and/or instruments and their related methods, and other embodiments are envisioned within the spirit and scope of the present application.

DETAILED DESCRIPTION

Figure 1:
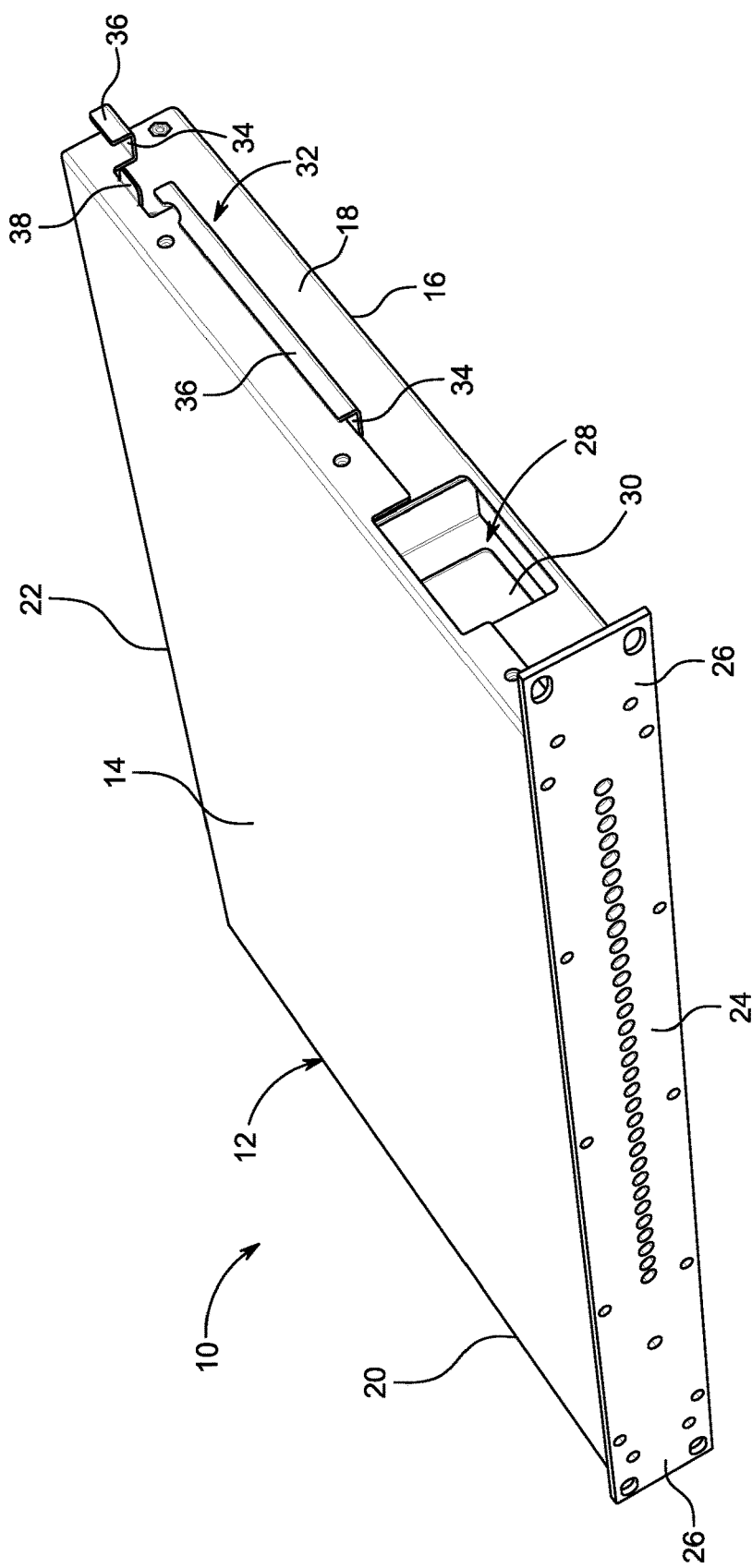
FIG. 1 is an elevational perspective view of an exemplary rack-mount chassis according to the present disclosure.

When introducing elements of various embodiments of the present inventions, the articles "a," "an," "the," and "said" are intended to mean that there are one or more of the elements. The terms "comprising," "including," and "having" are intended to be inclusive and mean that there may be additional elements other than the listed elements. Any examples of parameters are not exclusive of other parameters of the disclosed embodiments. Components, aspects, features, configurations, arrangements, uses and the like described, illustrated or otherwise disclosed herein with respect to any particular embodiment may similarly be applied to any other embodiment disclosed herein.

FIGS. 1-8 illustrate an exemplary mount-rack chassis 10 according to the present disclosure. As shown in FIGS. 1-8, the chassis 10 includes a housing portion 12 configured to house or contain, at least partially, one or more electronic or electrical component therein. The chassis 10 may be configured (e.g., sized and/or shaped) to mount to a pre-existing or pre-determined electronic equipment rack. For example, the chassis 10 may be configured according to a standardized chassis design that mounts to a corresponding standardized rack. However, in some other embodiments the chassis 10 may not be configured according a standardized chassis design, and may be configured to mount with one or more standardized and/or non-standardized racks.

As shown in FIGS. 1-8, the housing portion 12 of the chassis 10 may include a top portion, surface or panel 14 and a bottom portion, surface or panel 16 that substantially opposes the top portion 14. As also shown in FIGS. 1-8, the housing portion 12 may include a first side portion, surface or panel 18 and a second side portion, surface or panel 20 that substantially opposes the first side portion 18. The housing portion 12 may further include a back or rear portion or end 22 that extends between the top portion 14 and the bottom portion 16, and between the first and second side portions 18, 20. The first side portion 18 may extend between the top and bottom portions 14, 16, and the back portion 22 and the front portion 24. Similarly, the second side portion 20 may extend between the top and bottom portions 14, 16, and the back portion 22 and the front portion 24.

Figure 2:
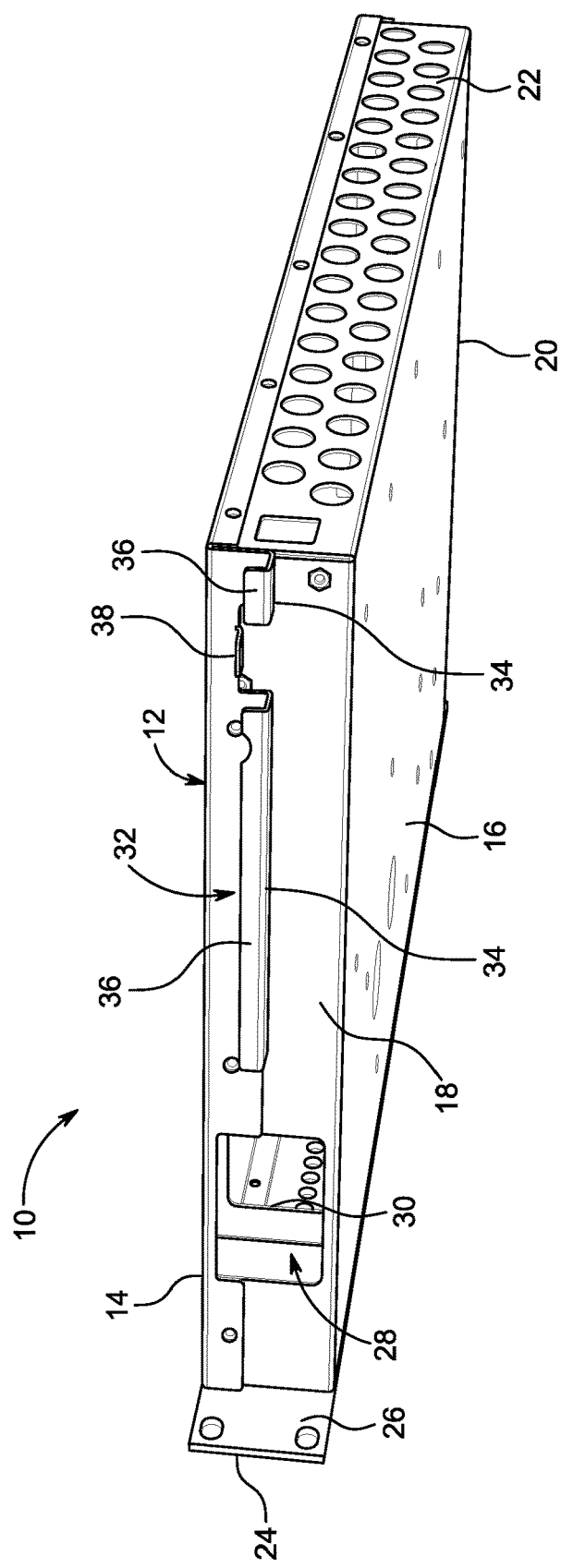
FIG. 2 is a bottom perspective view of the exemplary rack-mount chassis of FIG. 1.
Figure 3:
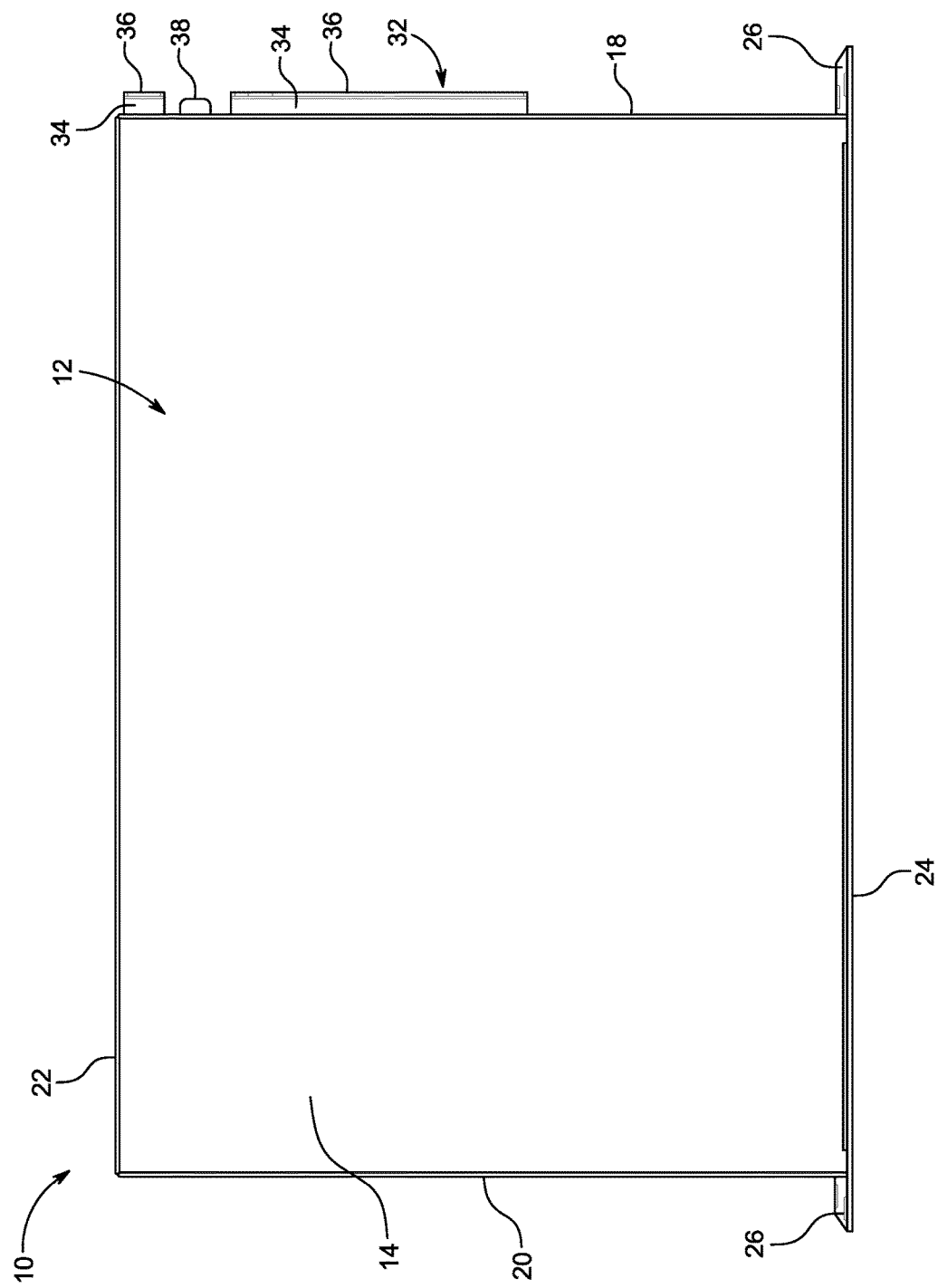
FIG. 3 is a top view of the exemplary rack-mount chassis of FIG. 1.
Figure 4:
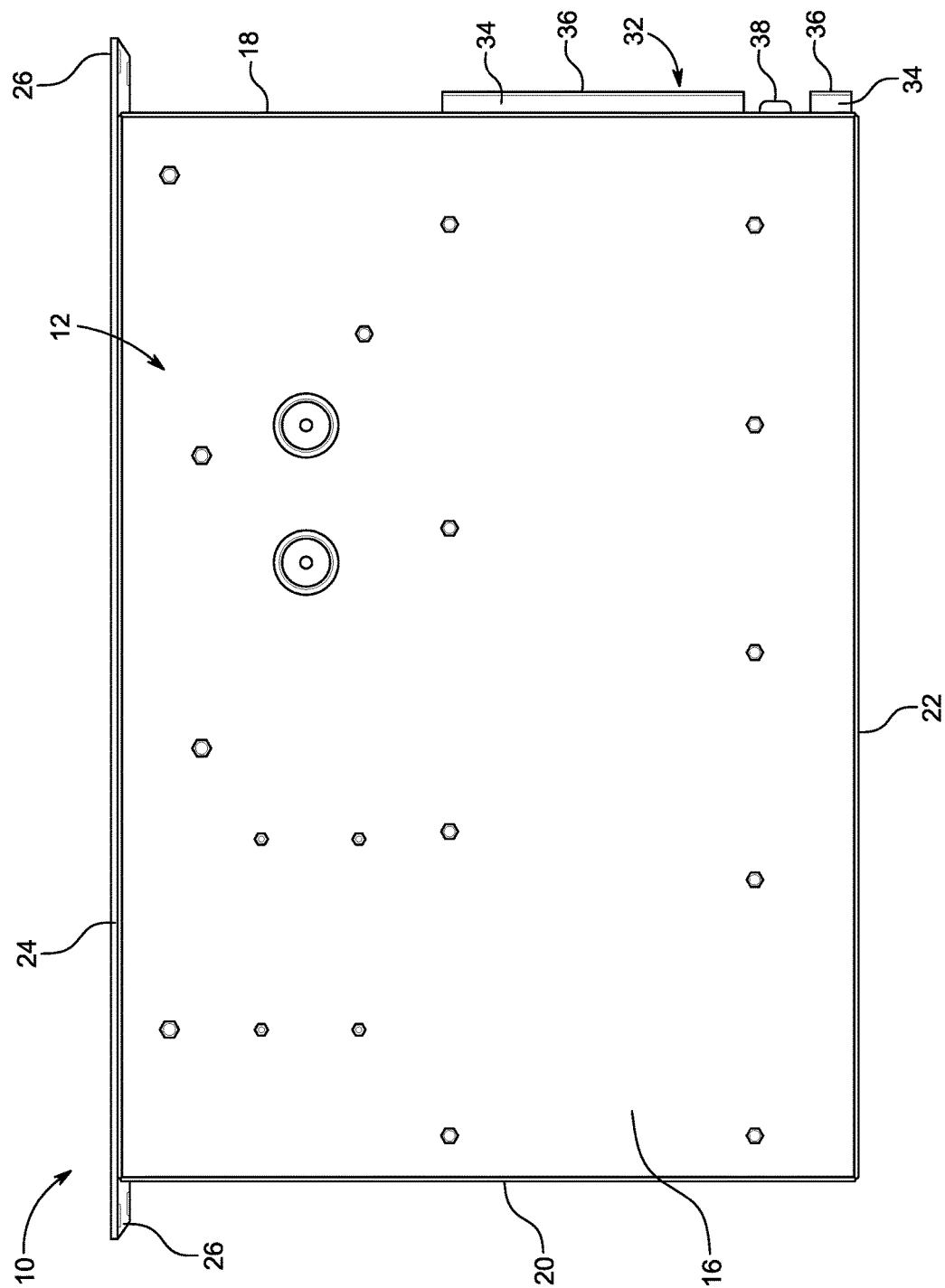
FIG. 4 is a bottom view of the exemplary rack-mount chassis of FIG. 1.
Figure 5:
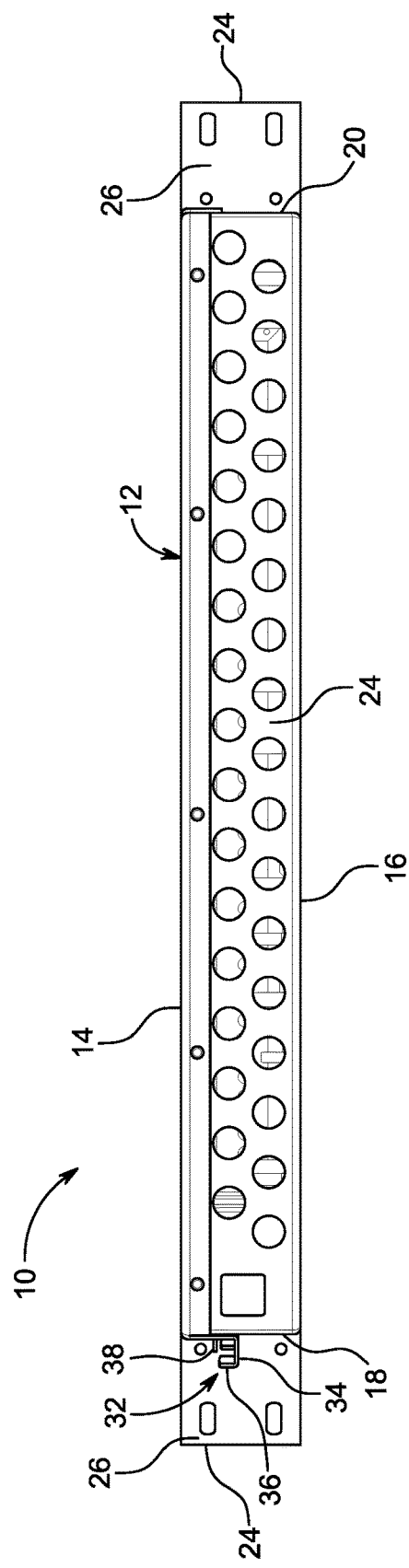
FIG. 5 is a back view of the exemplary rack-mount chassis of FIG. 1.
Figure 8:
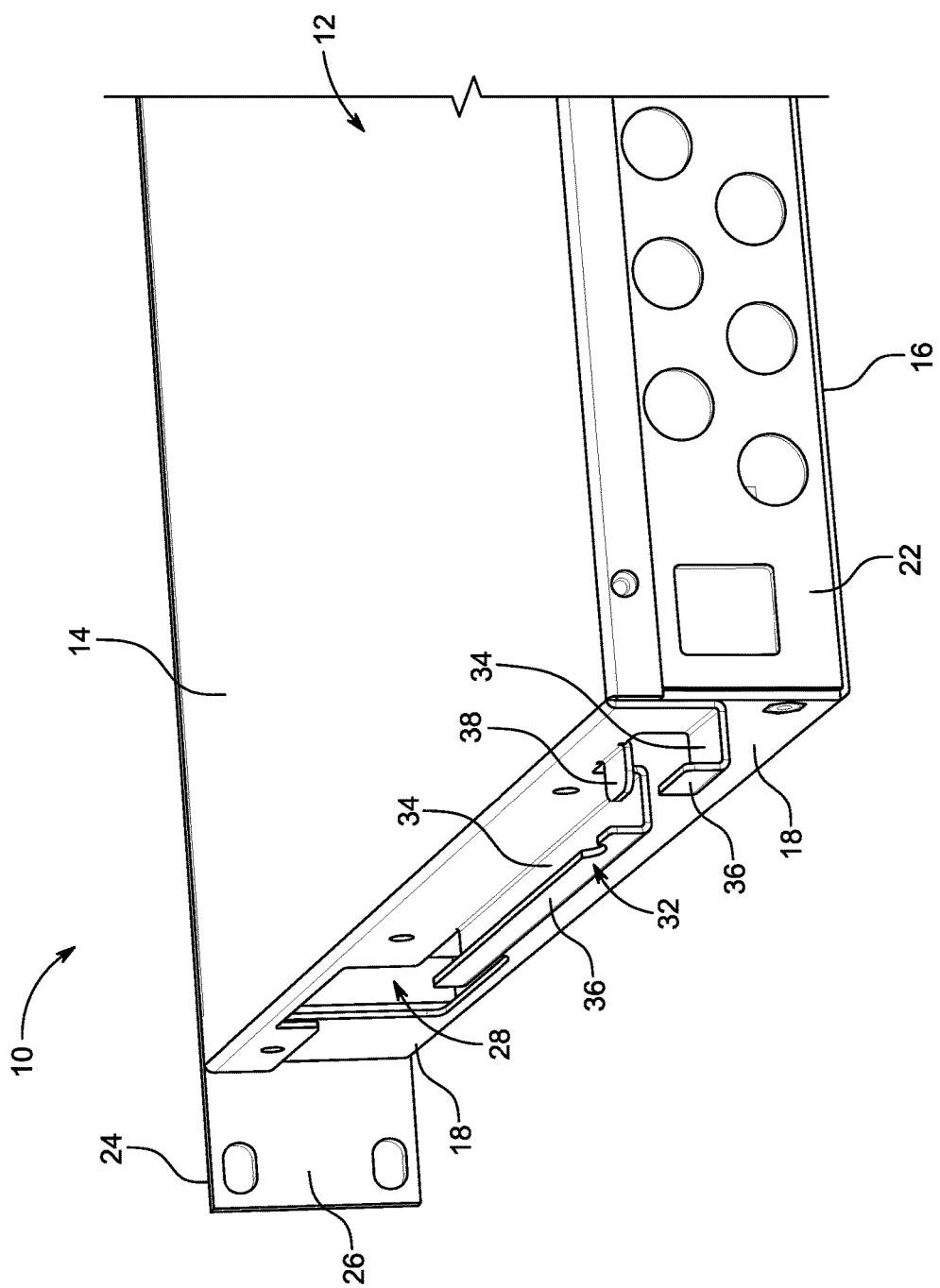
FIG. 8 is a rear perspective view of a portion of the exemplary rack-mount chassis of FIG. 1 illustrating an exemplary recessed portion and an exemplary cord support mechanism.
Figure 9:
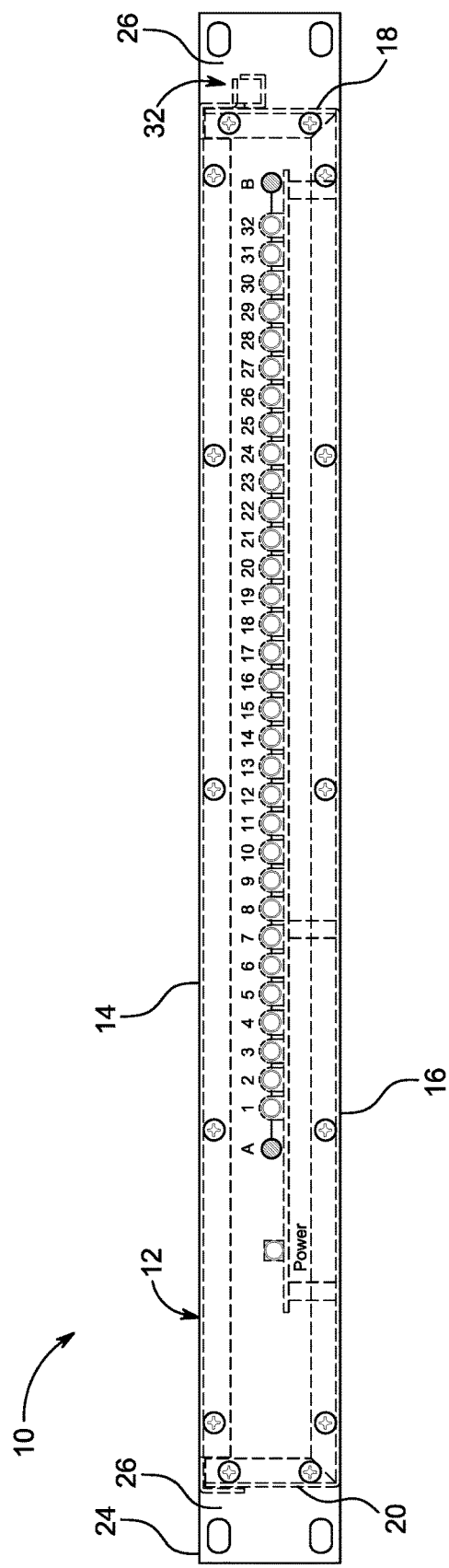
FIG. 9 is a front view of the exemplary rack-mount chassis of FIG. 1 with at least one exemplary electronic component installed.
Figure 10:
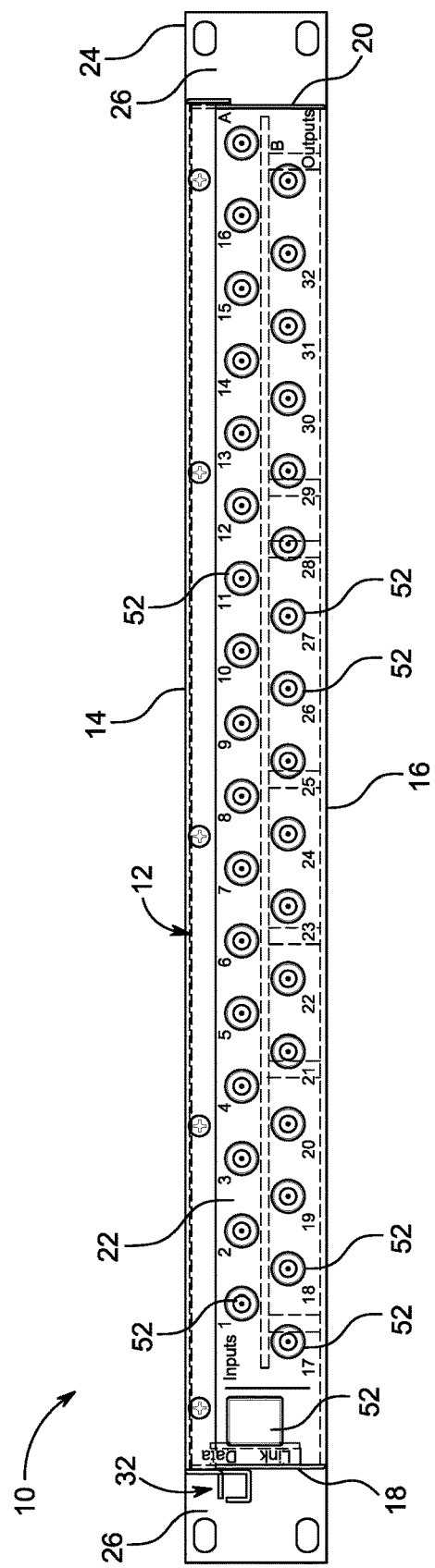
FIG. 10 is a back view of the exemplary rack-mount chassis of FIG. 9.

The housing 12 may be configured to form a cavity or space that houses at least one electronic component at least partially therein, as discussed further below. The at least one electronic component may be coupled or affixed to one or more portions of the housing 12. In some embodiments, the back portion 22 may include apertures or other features that allow access and/or form a passageway to and/or from at least one electronic component housed within or on the housing 12, as shown in FIGS. 2, 5 and 8. For example, a relatively large number of input and/or output connectors or connections (i.e., electrical connections or ports, as opposed to power couplers) may be provided at, or are accessible through, the back portion 22 of the chassis 10. In some embodiments, the back portion 22 may be substantially filled or encompassed with features for input and/or output connectors or connections or other non-power coupler mechanisms, as shown in FIGS. 2, 5 and 8.

Figure 6:
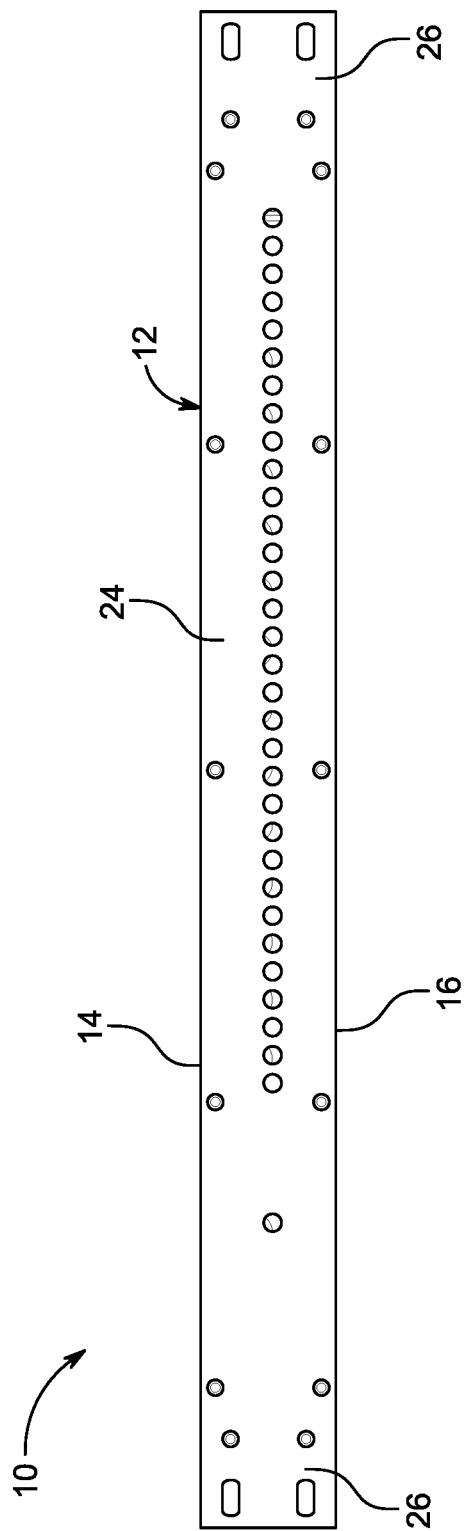
FIG. 6 is a front view of the exemplary rack-mount chassis of FIG. 1.

The chassis 10 may further include a front portion, panel or plate 24 that may form the front face of the housing 12, as shown in FIGS. 1-8. The front portion 24 may be coupled to the front ends or aspects of the top portion 14, bottom portion 16, first side portion 18 and/or second side portion 20. The front portion 24 may be wider than the width of the housing 12 such that it includes ears or mounting portions 26 that extend or protrude past the first side portion 18 and/or the second side portion 20, as shown in FIGS. 1-8. The mounting portions 26 of the front portion 24 may include mounting apertures or other features that are configured to allow the chassis 10 to be mounted to an electronic equipment rack. For example, the mounting portions 26 of the front portion 24 may be coupled (e.g., via mounting apertures and fasteners or other mechanisms) to corresponding posts (e.g., a pair of front posts) of an electronic equipment rack such that the housing 12 extends into, and is at least substantially positioned within, the rack. In some embodiments, the front portion 24 may also include apertures or other features that allow access and/or passageways to and/or from at least one electronic component housed within or on the housing 12, as shown in FIGS. 1 and 6.

It is noted that the front portion 24, the back portion 22, the top portion 14, the bottom portion 16, the first side portion 18, the second side portion 20, the housing 12 and/or the chassis 10 itself may be any shape, size or other physical configuration. For example, the front portion 24 and/or the chassis 10 itself may define one or more rack unit in height. As another example, the width and depth of the chassis 10 may be configured to cooperate or be compatible with a standardized or pre-existing rack. Further, although depicted as substantially rectilinear in FIGS. 1-8, the side portions of the chassis 10 may be any shape or orientation. Further, the front portion 24, the back portion 22, the top portion 14, the bottom portion 16, the first side portion 18, the second side portion 20, the housing 12 and/or the chassis 10 may be made from one or more component and/or material.

As shown in FIGS. 1, 2, 7 and 8, the rack-mount chassis 10 may include at least one recessed portion 28 extending or offset from the first side portion 18 of the housing 12 toward the interior of the housing 12. The at least one recessed portion 28 may be positioned further towards the interior of the housing 12 and/or the second side portion 20 as compared to other portions of the first side portion 18 of the housing 12 (e.g., as compared to non-recessed portion(s) and/or less-recessed portion(s)). The at least one recessed portion 28 of the first side portion 18 of the housing 12 may be any shape, size, orientation and degree of recess into the interior of the housing 12. The at least one recessed portion 28 may be formed of one or more separate and distinct component as compared to at least one other portion of the first side portion 18, and/or may include one or more integral component.

In some embodiments, the at least one recessed portion 28 of the first side portion 18 may be spaced from the back portion 22 toward the front portion 24. For example, in some embodiments the at least one recessed portion 28 may be positioned proximate to the front portion 24 and distal to the back portion 22 (i.e., positioned closer to the front portion 24 than the back portion 22 along the depth of the chassis 10). It is noted that, in use, if the front portion 24 of the chassis 10 is coupled to an electronic equipment rack and the back portion 22 and/or rear portion of the housing 12 is not coupled to the rack, a moment force will be created between the front portion 24 and the housing 12 that will stress the connection between the front portion 24 and the housing 12 and act along the depth of the housing 12. As explained further below, the at least one recessed portion 28 may allow for at least one power coupler and a power cord to couple to the chassis 10 to power the at least one electronic component thereof. Therefore, the closer the recessed portion 28 is positioned to the front portion 24, the further forward the center of mass of the chassis 10 will be (toward the front portion 24 and rack connection point(s)) to reduce such moment forces. However, it is specifically noted that the at least one recessed portion 28 may be positioned anywhere along the depth of the first side portion 18.

The at least one recessed portion 28 may also be positioned anywhere along the height of the first side portion 18. In some embodiments, the at least one recessed portion 28 may extend between the top and bottom portions 14, 16 of the housing 12. In other embodiments, the at least one recessed portion 28 may only extend partially between the top and bottom portions 14, 16 of the housing 12. The at least one recessed portion 28 may also be of any size, shape and orientation. In some embodiments, the at least one recessed portion 28 may be sized, shaped and otherwise configured such that at least one power coupler can be mounted thereto, and a plug of a power cord is able to mate with the power coupler. Still further, although one recessed portion 28 in the first side portion 18 is depicted in the exemplary embodiment illustrated FIGS. 1-8, the first side portion 18 may include multiple recessed portions 28. In some embodiments, instead of or in addition to the first side portion 18, the second side portion 20 of the housing 12 may include at least one recessed portion 28 (not shown). For example, the second side portion 20 of the housing 12 may include one recessed portion 28 or a plurality of recessed portions 28 (and the first side portion 18 may or may not also include at least one recessed portion 28).

Figure 7:
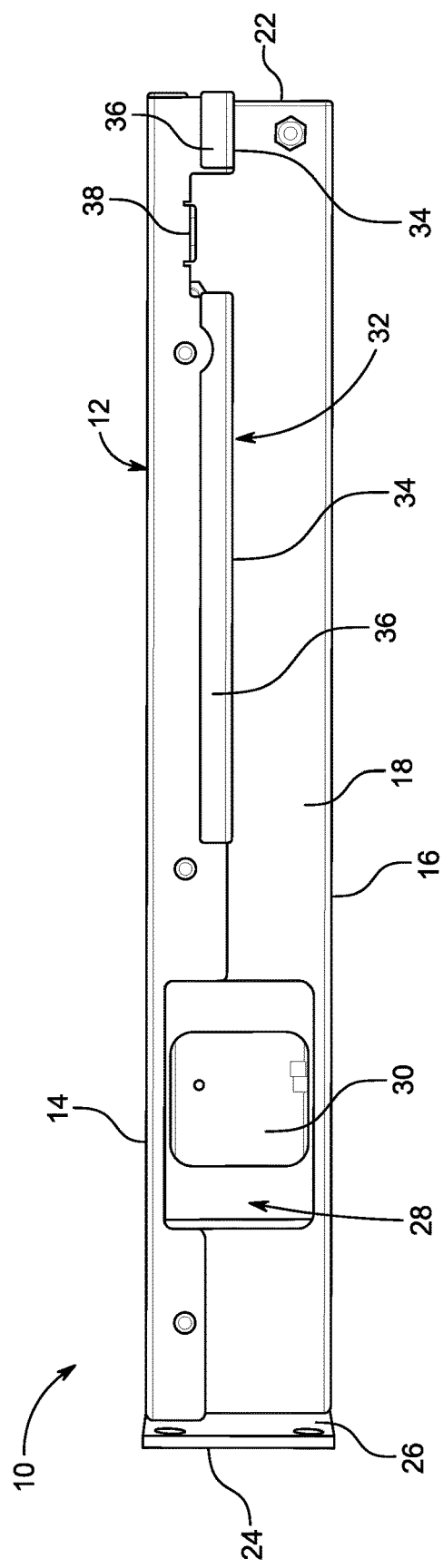
FIG. 7 is a side view of the exemplary rack-mount chassis of FIG. 1.

As shown in FIGS. 1, 2 and 7, the at least one recessed portion 28 of the chassis 10 may include or define at least one aperture 30 therethrough. The at least one aperture 30 may extend through the at least one recessed portion 28 of the first side portion 18 (or of the second side portion 20) and thereby create a passageway into the interior or cavity of the housing 12. In some embodiments, the at least one recessed portion 28 may include a single aperture 30, as shown in FIGS. 1, 2 and 7. In other embodiments, the at least one recessed portion 28 may include a plurality of apertures 30 (not shown). The at least one aperture 30 in the at least one recessed portion 28 (of the first side portion 18 and/or of the second side portion 20) may be of any size, shape and configuration. In some embodiments, as explained further below, the at least one aperture 30 may be configured to mechanically couple, mount or support at least one power coupler (or a substrate or structure that includes at least one power coupler). The at least one aperture 30 may thereby allow at least one power coupler to couple to the at least one recessed portion 28 (either directly or indirectly) and extend into the interior of the housing 12. The at least one power coupler may thereby be accessible from adjacent to the respective first or second side portion 18, 20. The at least one recessed portion 28 and the at least one aperture 30 thereof may allow the at least one side-mounted power coupler to input electrical power (e.g., via a power cord coupled therewith) into the housing 12 and to the at least one electronic component therein to power the at least one electronic component. In this way, the back portion 22 of the housing 12 may be void of an electrical power coupler that carries electrical power into the housing 12 to power the at least one electronic component therein.

In some embodiments, the at least one recessed portion 28 and the at least one aperture 30 may be configured such that at least one power coupler that is coupled thereto does not extend past the non-recessed or outermost portion of the respective the first or second side portion 18, 20 of the chassis 10 (or at least prevent the chassis 10 from mounting in a rack). Similarly, in some embodiments, the at least one recessed portion 28 and the at least one aperture 30 thereof may be configured such that at least one power cord mated with at least one power coupler that is coupled thereto does not extend past the non-recessed or outermost portion of the respective first or second side portion 18, 20 of the chassis 10 (or at least does not extend outwardly to such an extent that prevents the chassis 10 from mounting in a rack).

As shown in FIGS. 1-5, 7 and 8, the rack-mount chassis 10 may include at least one cord support mechanism 32 that extends outwardly from the first side portion 18. The at least one cord support mechanism 32 may be positioned between the at least one recess portion 28 (and the at least one power coupler mounted thereto) and the back portion 22 of the housing 12, as shown in FIGS. 1-5, 7 and 8. The at least one cord support mechanism 32 may be configured to support and route at least one power cord coupled to the at least one power coupler along the first side portion 18 and past the back portion 22. For example, in some embodiments the at least one cord support mechanism 32 may be configured to prevent at least one power cord from sagging below the bottom portion 16 of the housing 12, extending away from the first side portion 18 of the housing 12, extending above the top portion 14 of the housing 12, and/or to configured to prevent contact or pinching of the at least one power cord by an electronic equipment rack housing the chassis 10 (such as during installation and/or removal of the chassis 10 with the rack).

In some embodiments, the at least one cord support mechanism 32 may include at least one first portion 34 that extends at least generally outwardly from (or inwardly to) the first side portion 18, as shown in FIGS. 1-5, 7 and 8. In some embodiments, the at least one first portion 34 of the at least one cord support mechanism 32 may be extended along the depth dimension of the chassis 10 between the front and back portions 24, 22, or a plurality of first support portions may be spaced along the depth of the first side portion 18. The at least one first portion 34 may be configured to physically support at least one power cord thereon that extends from the at least one recessed portion 28 such that it does not sag or extend below the bottom portion 16 of the housing 12 as it extends along the first side portion 18 and past the back portion 22.

As also shown in FIGS. 1-5, 7 and 8, in some embodiments the at least one cord support mechanism 32 may form a channel with the first side portion 18 that prevents at least one power cord that extends from the at least one recessed portion 28 to extend outwardly away from the first side portion 18. For example, the at least one cord support mechanism 32 may include at least one second portion 36 that is angled with respect to the first portion 34 thereof. The at least one first portion 36 of the at least one cord support mechanism 32 may extend from the at least one first portion 34 in a direction extending at least generally between the top and bottom portions 14, 16, as shown in FIGS. 1-5, 7 and 8. In some embodiments, the second portion 36 of the at least one cord support mechanism 32 may be extended along the depth dimension between the front and back portions 24, 22, or a plurality of second support portions 36 may be spaced along the depth of the first side portion 18. The at least one second portion 36 of the at least one cord support mechanism 32 may prevent at least one power cord from extending away from the first side portion 18 of the housing 12 as it extends from the at least one recced portion 28 and along the first side portion 18 and past the back portion 22. The at least one second portion 36 of the at least one cord support mechanism 32 may also prevent contact or pinching of at least one power cord extending from the at least one recced portion 28 by an electronic equipment rack that houses the chassis 10, such as during installation and/or removal of the chassis 10 with the rack.

The at least one cord support mechanism 32 may physically prevent at least one power cord extending from the at least one recessed portion 28 from extending above the top portion 14 of the housing 12 as it extends along the first side portion 18 and past the back portion 22 via at least one third portion 38. In some embodiments, the at least one third portion 38 of the at least one cord support mechanism 32 may extend from the first side portion 18, as shown in FIGS. 1-5, 7 and 8. In other embodiments, the third portion 38 may extend from the first and/or second portions 34, 36 of the at least one cord support mechanism 32. The at least one a third portion 38 may extend at least generally outwardly from (or inwardly to) the first side portion 18, and be positioned above at least the first portion 34, as shown in FIGS. 1-5, 7 and 8. The at least one third portion 38 of the at least one cord support mechanism 32 may be extended along the depth dimension between the front and back portions 24, 22, or a plurality of third support portions may be spaced along the depth of the first side portion 18.

In the illustrated embodiment, the at least one third portion 38 of the at least one cord support mechanism 32 is positioned on the first side portion 18 of the housing 12 proximate or adjacent to the back portion 22, as shown in FIGS. 1-5, 7 and 8. As also shown in FIGS. 1-5, 7 and 8, the at least one cord support mechanism 32 may include two first and second portions 34, 36 that are spaced from each other along the depth direction. The at least one third portion 38 of the at least one cord support mechanism 32 may be positioned within such a space or gap (and higher than the at least the first portions 34) to prevent at least one power from extending from the at least one recessed portion 28 from extending above the top portion 14 of the housing 12.

In some embodiments, the first and second portions 36 of the at least one cord support mechanism 32 may for an "L" shape. However, other configurations of the first and second portions 34, 36 (and the third portion 38) of the at least one cord support mechanism 32 may be utilized that physically supports and routes at least one power cord extending from the at least one recessed portion 28 (e.g., from a power coupler coupled thereto) to prevent it from extending below the bottom portion 16 of the housing 12, extending away from the first side portion 18 of the housing 12, extending above the top portion 14 of the housing 12, and/or prevent contact or pinching by an electronic equipment rack containing the chassis 10 (such as during installation and/or removal of the chassis 10 into/from the rack). In some embodiments, multiple cord support mechanisms 32, or multiple first portions 34, second portions 36 and/or third portions 38 thereof, may be provided to support and route one or more power cords extending from one or more recessed portions 28 (and one or more power couplers coupled therein). Further, although one cord support mechanisms 32 is depicted only on the first side portion 18 of the exemplary chassis 10 of the embodiment of FIGS. 1-8, the first side portion 18 and/or the second side portion 20 of the housing 12 may include one or more cord support mechanisms 32 to support and/or guide one or more power cords extending from one or more recessed portions 28 and associated power coupler(s). In this way, only the first side portion 18 of the housing 12 may include the at least one cord support mechanism 32, only the second side portion 20 of the housing 12 may include the at least one cord support mechanism 32, or both the first side portion 18 and the second side portion 20 of the housing 12 may include the at least one cord support mechanism 32.

Figure 11:
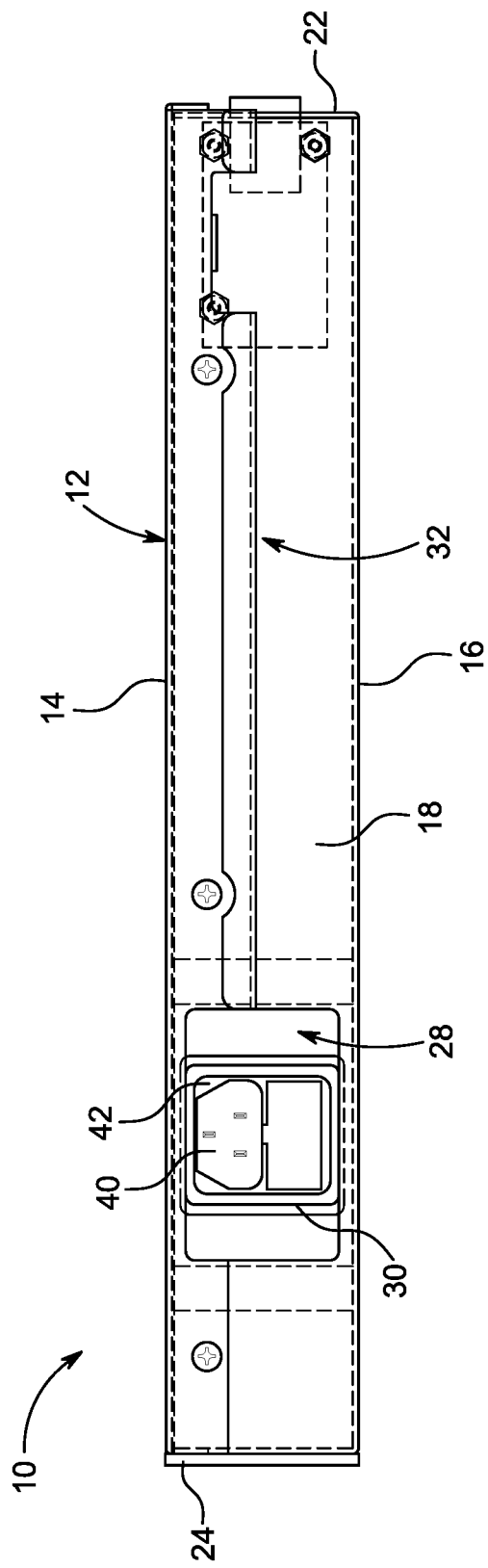
FIG. 11 is a side view of the exemplary rack-mount chassis of FIG. 9 with an exemplary power coupler installed within the recessed side portion.
Figure 12:
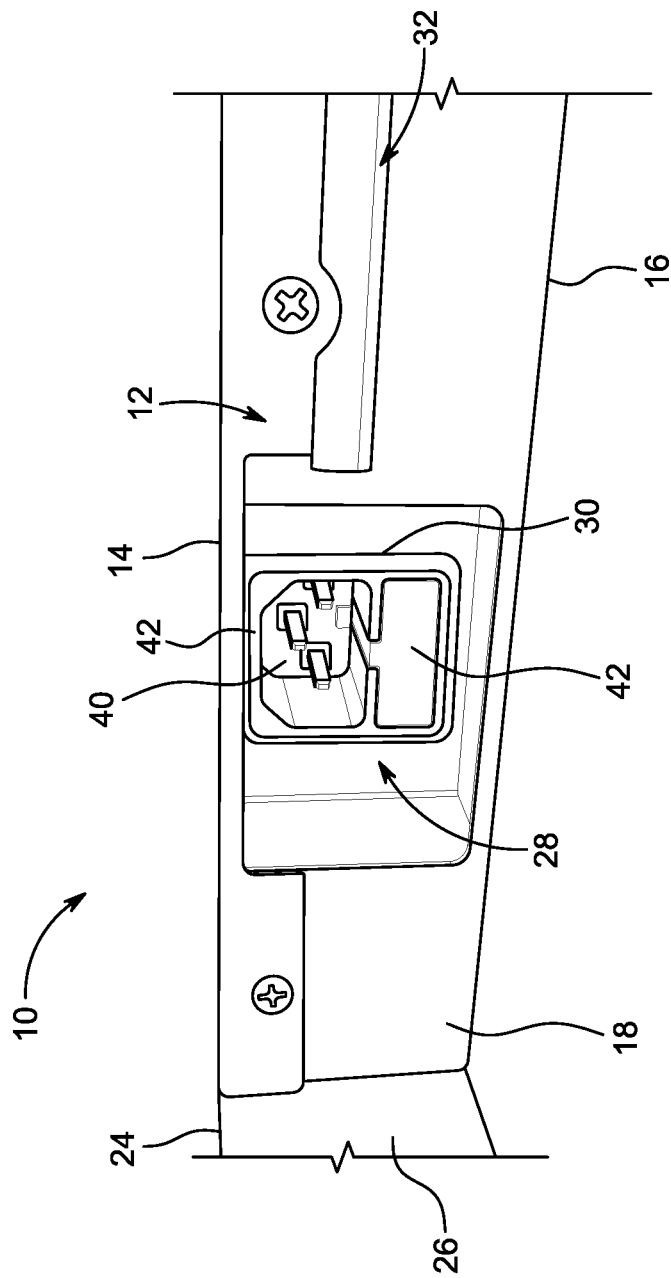
FIG. 12 is a side perspective view of a portion of the exemplary rack-mount chassis of FIG. 11.
Figure 13:
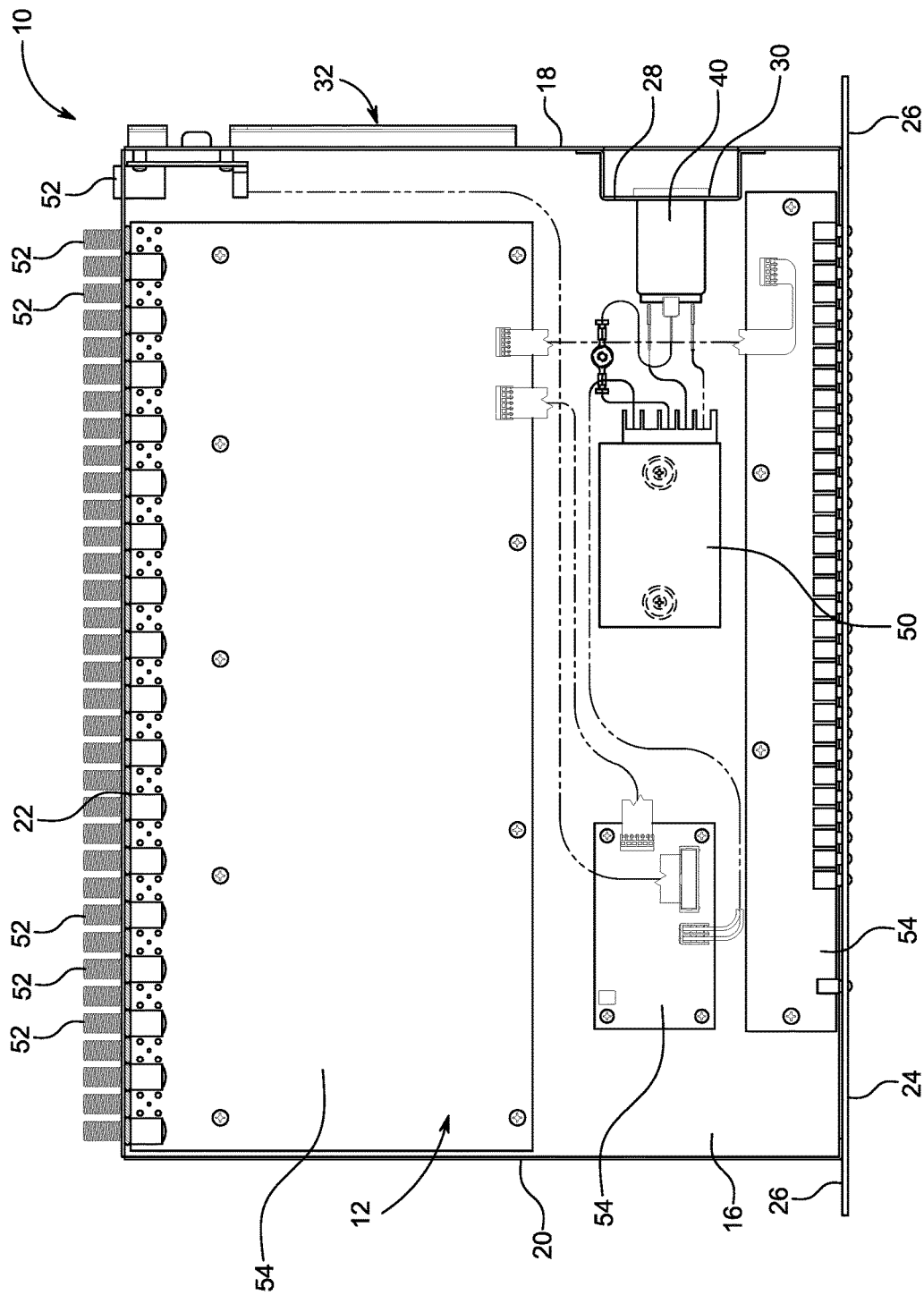
FIG. 13 is a top cross-sectional view of the exemplary rack-mount chassis of FIG. 11.

FIGS. 9-13 illustrate the exemplary rack-mount chassis 10 of FIGS. 1-8 with an exemplary electrical power coupler 40 and at least one electronic component 54 installed in the chassis 10. As shown in FIGS. 11-13, at least one electrical power coupler 40 may be coupled within the at least one aperture 30 within the at least one recessed portion 28 of the housing 12 of the chassis 10. The electrical power coupler 40 may thereby extend through the at least one aperture 30 of the at least one recessed portion 28. As shown in FIG. 13, the electrical power coupler 40 may not extend past the non-recessed portion(s) of the first side portion 18. The electrical power coupler 40 may thereby be positioned within the at least one recessed portion 28, within the at least one aperture 30, and/or within the cavity of the housing 12, as shown in FIG. 13.

The electrical power coupler 40 may be any power coupler configured to mechanically and electrically couple (e.g., removably or selectively couple) with at least one electrical power cord, and when coupled therewith conduct or transmit electric power from the at least one electrical power cord to the at least one electronic component 54 of the chassis 10. For example, the electrical power coupler 40 may be a male coupler or a female coupler. In some embodiments, the electrical power coupler 40 may be a standardized coupler configured to mate with a corresponding standardized power cord (e.g., a standardized plug of a power cord).

In some embodiments, the at least one electrical power coupler 40 may be incorporated or coupled with a filler panel or frame 42 that closes off or seals any gap or space between the coupler 40 and the edges of the at least one aperture 30, as shown in FIGS. 11 and 12. In this way, the at least one coupler 40 and the filler panel 42 may be configured to couple to the at least one aperture 30 and at least substantially close off or seal the at least one aperture 30, as shown in FIGS. 11 and 12.

As shown in FIG. 13, the at least one electrical power coupler 40 may be electrically coupled (either directly or indirectly) to at least one electronic component 54 provided or coupled within the housing 12. As noted above, the at least one electronic component 54 (and thereby the chassis 10 itself) may be configured for any purpose or function. In some embodiments, the chassis 10 may include a plurality of electronic components 54 that receive electrical power, either directly or indirectly, from the at least one coupler 40, as shown in FIG. 13. As also shown in FIG. 13, the chassis 10 may include input and/or output connectors or connections 52 (i.e., electrical connections or ports) that are coupled to, or form part of, the at least one electrical power coupler 40. For example, the back portion 22 may be substantially filled or occupied with input and/or output connectors 52 or other non-power coupler mechanisms. It is noted that as the chassis 10 includes the at least one electrical power coupler 40 in a side portion thereof (i.e., the first and/or second side portions 18, 20), the back portion 22 may be void of an electrical power coupler 40 and, thereby, include more physical space for input and/or output connectors 52 or other non-power coupler mechanisms.

As also shown in FIG. 13, in some embodiments the housing 12 may include at least one internal power supply mechanism 50 configured to receive electrical power from the at least one electrical power coupler 40 and condition, regulate or otherwise modify the received electrical power and output such modified power to the at least one at least one electronic component 54. The at least one internal power supply mechanism 50 may thereby be electrically coupled between the at least one power coupler 50 and the at least one electronic component 54. In some other embodiments, however, the chassis 10 may be void of an internal power supply mechanism 50. For example, in some embodiments the at least one electrical power cord may receive power from at least one external power supply mechanism, such as a DC brick, adapter or other mechanism that modifies received electrical power. In some embodiments, the chassis 10 may not include or couple with an interior or exterior power supply mechanism.

Figure 14:
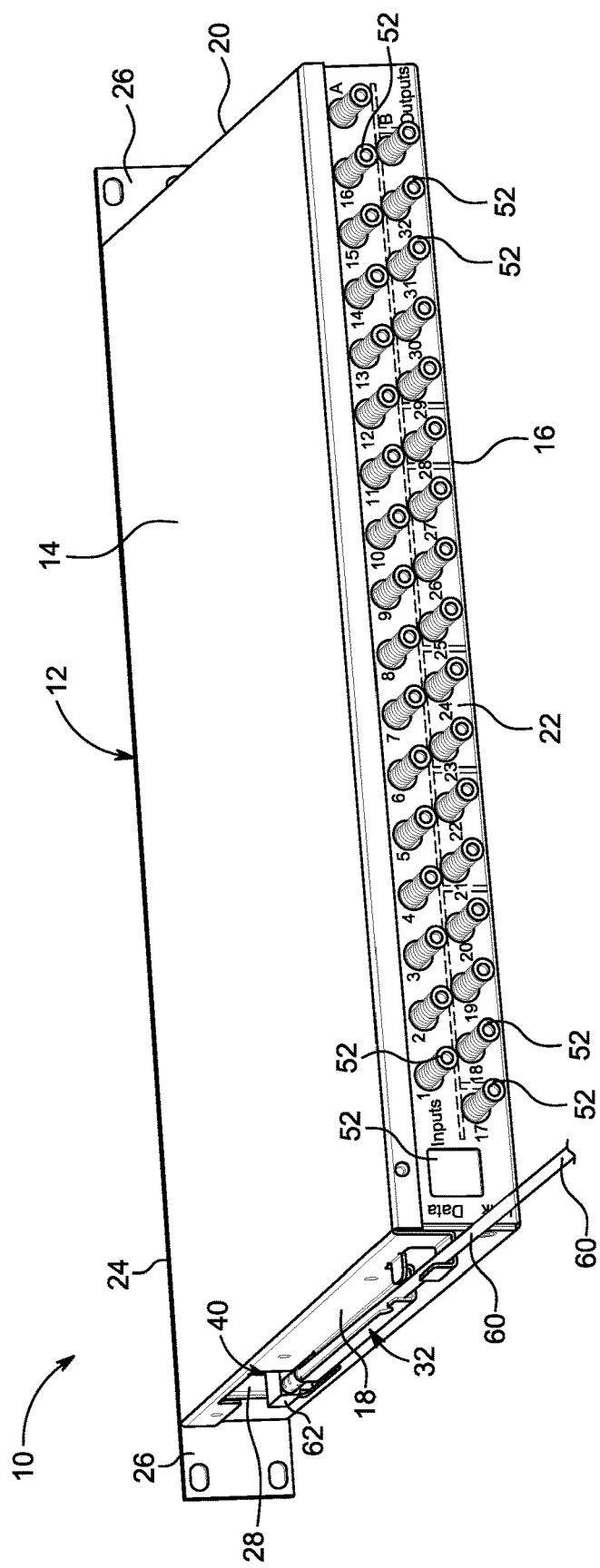
FIG. 14 is a rear elevational perspective view of the exemplary rack-mount chassis of FIG. 11 with an exemplary power cord coupled to the power coupler.
Figure 15:
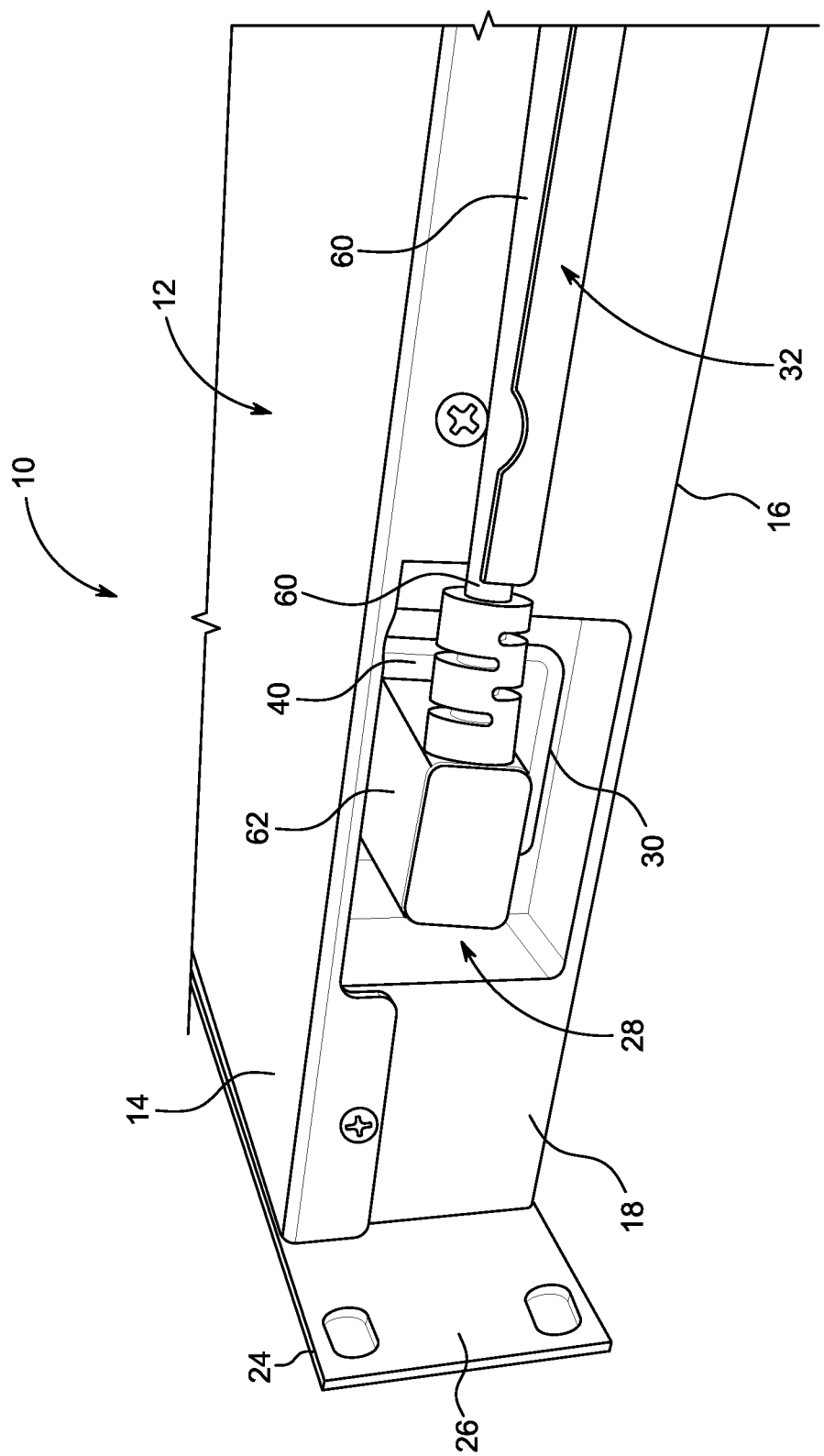
FIG. 15 is a side perspective view of a portion of the exemplary rack-mount chassis of FIG. 14 illustrating the exemplary power cord coupled to the power coupler.
Figure 16:
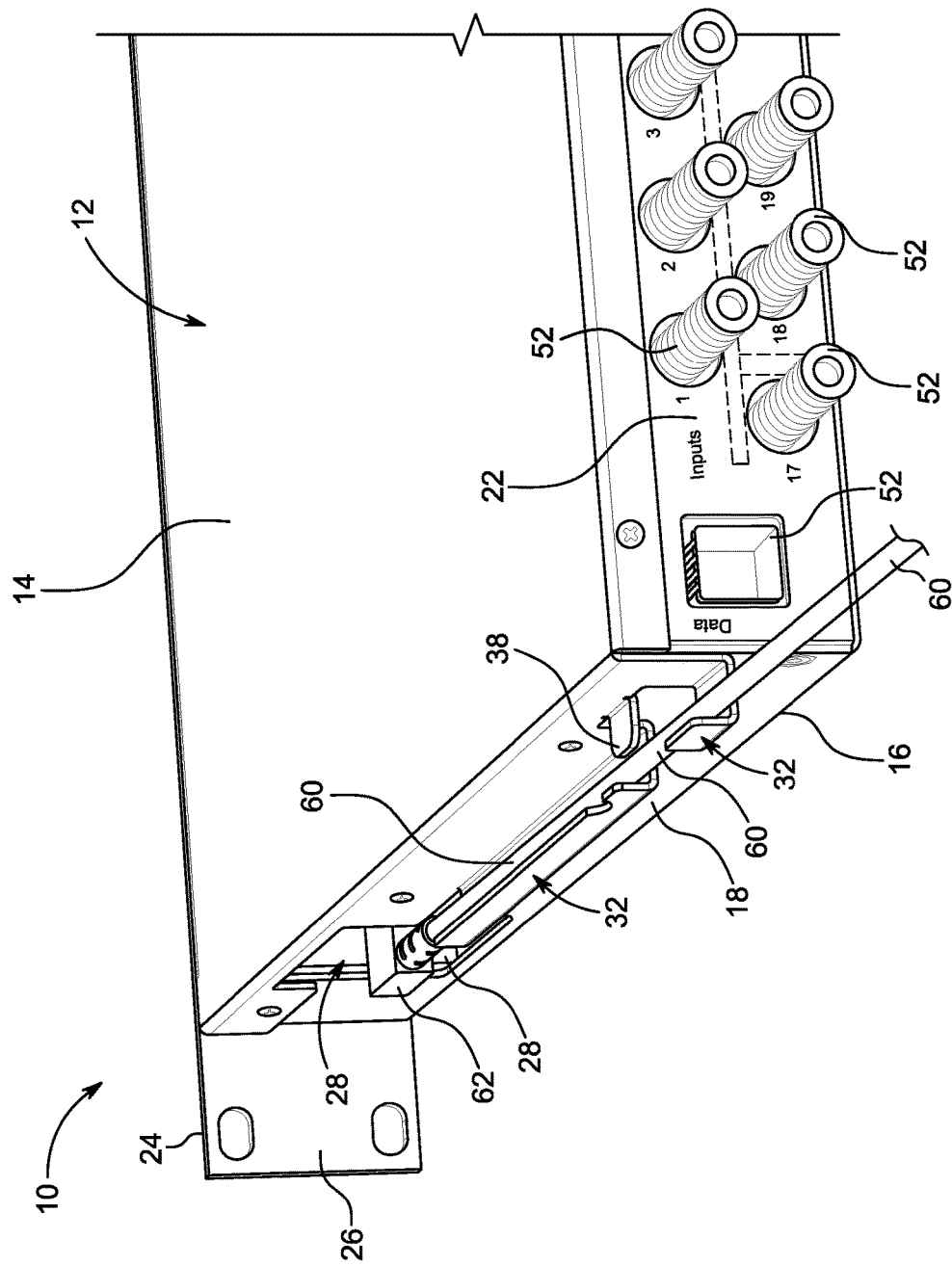
FIG. 16 is a rear perspective view of a portion of the exemplary rack-mount chassis of FIG. 14 illustrating the exemplary power cord coupled to the power coupler being supported by the cord support mechanism.

FIGS. 14-16 illustrate the exemplary electronic rack-mount chassis 10 of FIGS. 9-13 with at least one electrical power cord 60 coupled or mated to the at least one electrical power coupler 40 of the chassis 10. The rack-mount chassis 10 may include at least one electrical power cord 60 configured to couple to (or coupled to) the at least one electrical power coupler 40 of the chassis 10 to provide electrical power to the at least one electronic component 54 thereof, as discussed above. The electrical power cord(s) 60 associated with the chassis 10 may be any power cord capable of transferring, conducting or transmitting electrical power from an electrical power supply or source that is exterior to the chassis 10 to the at least one electrical power coupler 40 of the at least one recessed portion 28 on the first and/or second side portion 18, 20 of the chassis 10. It is noted that the exterior power supply or source may be any source or supply of any type or form of electrical power that is exterior to the chassis 10.

The at least one power cord 60 may include a plug or connector 62 (e.g., at an end of the cord 60) configured to mechanically and electrically couple to the at least one coupler 40, as shown in FIGS. 14-16. In some embodiments, the at least one power coupler of the chassis 10 and the plug 62 of the at least one power cord 60 may removably mechanically and electrically couple or mate. For example, in one such embodiment the plug 62 of the at least one power cord 60 and the at least one coupler 40 may be of a standardized design or type of selectively mating electrical connectors. In some embodiments, the plug 62 of the at least one power cord 60 and the at least one coupler 40 may be fixedly mechanically and/or electrically coupled.

The plug 62 of the at least one power cord 60, or the cord portion thereof, may extend along the respective first or second side portion 18, 20 of the chassis 10. For example, as shown in FIGS. 14-16 the plug 62 of the at least one power cord 60 may initially extend outwardly away from the respective at least one recessed portion 28 of the first or second side portion 18, 20 at it extends from the at least one power coupler 40 mated therewith. The plug 62, or the cord portion thereof, may then extend turn or angle and extend along the respective first or second side portion 18, 20 of the housing 12 towards the back portion 22, as shown in FIGS. 14-16. In some such embodiments, the plug 62 of the at least one power cord 60 may be a 90 degree or other angled/non-linear power plug or connector.

As shown in FIGS. 14-18, the at least one power cord 60 may be routed along the respective first or second side portion 18, 20 at it extends from at least one recessed portion 28 and power coupler 10 of the chassis 10 via the at least one cord support mechanism 32 (in addition to, or instead of, the plug 62 or another portion of the at least one power cord 60 itself). For example, as shown in FIGS. 14-18 at least one cord support mechanism 32 may be positioned and/or extended between the back portion 22 and the at least one recessed portion 28 and corresponding at least one power coupler 10, and the at least one power cord 60 mated with the at least one power coupler 10 may be routed by the at least one cord support mechanism 32 along the respective first or second side portion 18, 20 and past the back portion 22 of the chassis 10. As discussed above, the at least one cord support mechanism 32 may route the at least one power cord 60 such that it does not sag below the bottom portion 16 of the housing 12, does not extend away from the respective first or second side portion 18, 20 of the housing 12, and/or does extend above the top portion 14 of the housing 12.

Figure 17:
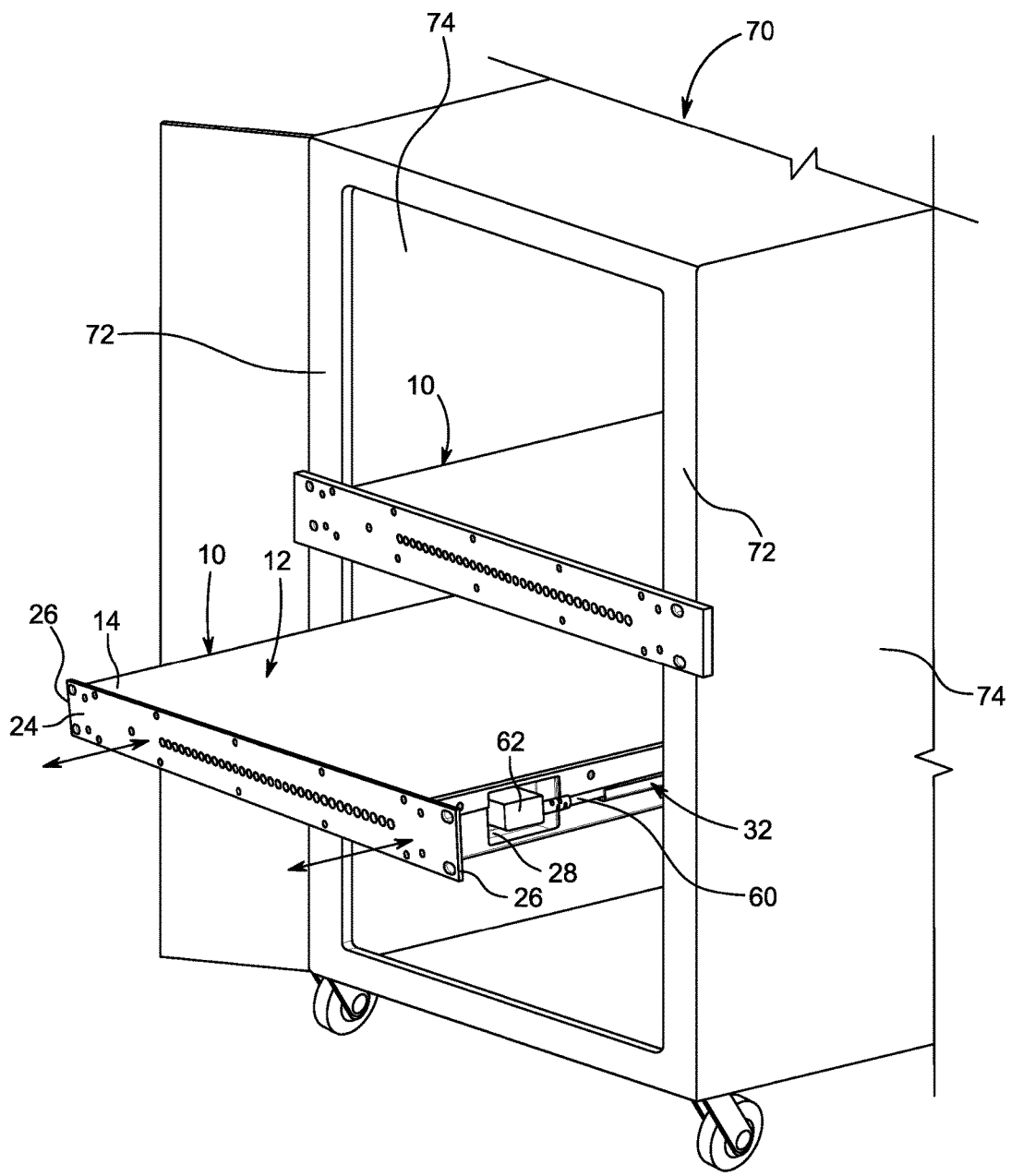
FIG. 17 is an elevational perspective view of the exemplary rack-mount chassis of FIG. 14 being mounted in an exemplary electronic equipment rack.
Figure 18:
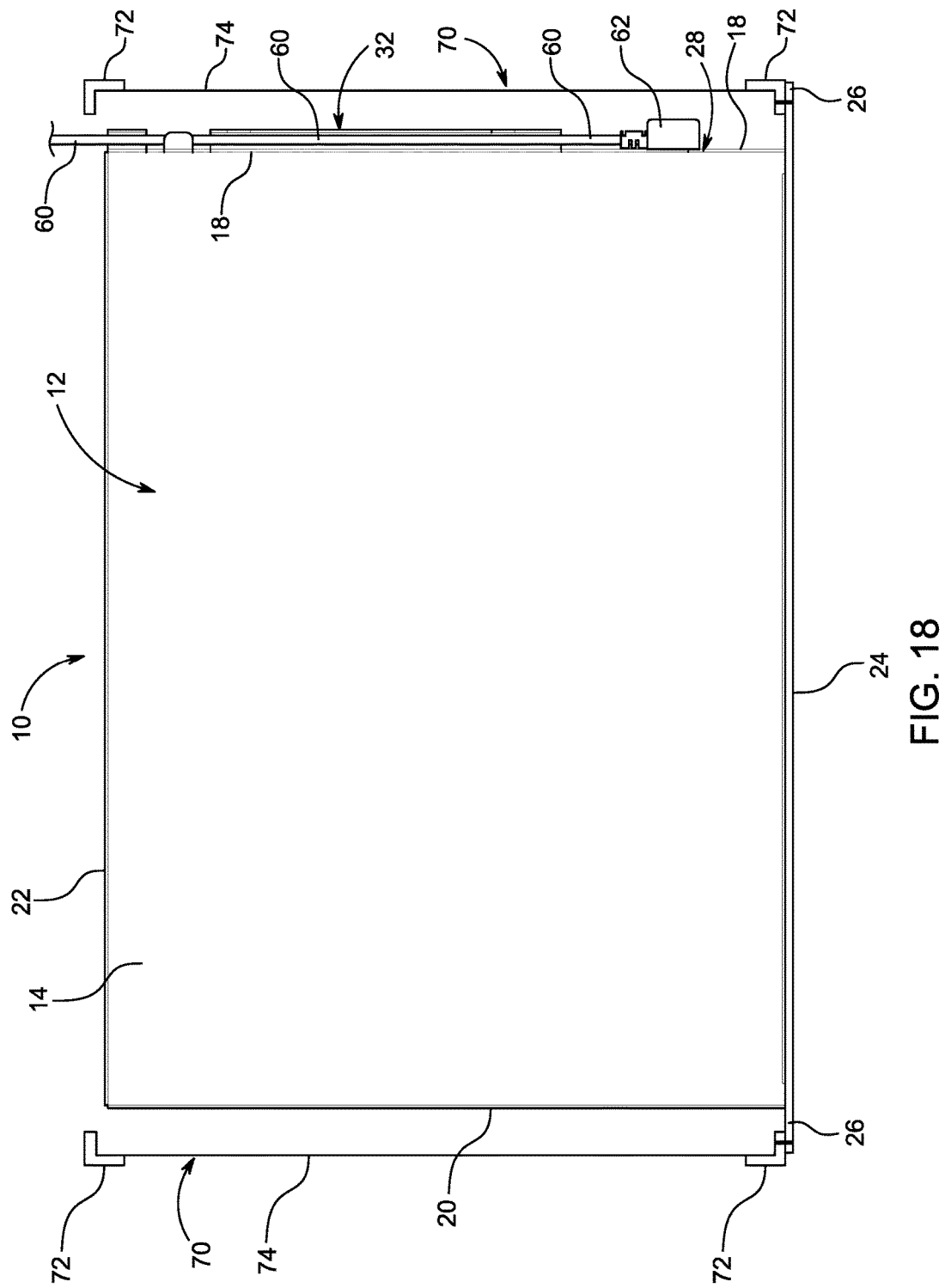
FIG. 18 is a top cross-sectional view the exemplary rack-mount chassis mounted in the exemplary electronic equipment rack of FIG. 17.

As also discussed above and shown in FIGS. 17 and 18, the at least one cord support mechanism 32 may route the at least one power cord 60 such that it is prevent from contacting and/or becoming pinched by an electronic equipment rack 70 that houses or contains the chassis 10 (such as during installation and/or removal of the chassis 10 with the rack 70). As shown in FIGS. 17 and 18, the chassis 10 may be installed or mounted to a rack 70 that includes support posts 72 and/or side panels 74. The chassis 10 may be configured to mount to the rack 70 such that the housing 12 extends into the interior of the rack 70. For example, as shown in FIG. 18 the front panel 24 of the chassis 10 may couple to front posts 72 of the rack 70 and the housing 12 may be positioned within the interior of the rack 70, such as between the posts 72 and side panels 74 of the rack 70.

As shown in FIG. 18, the at least one power cord 60 may extend, at least partially due to the at least one cord support mechanism 32, along the first side portion 18 of the chassis 10 such that it is spaced from the posts 72 and side panels 74 of the rack 70. Further, the at least one cord support mechanism 32 may route the at least one power cord 60 out past the back or rear portion 22 of the chassis 10, potentially between the first side portion 18 and an adjacent rear post 72 of the chassis 10 as shown in FIG. 18. The at least one cord support mechanism 32 may thereby assist in preventing the at least one power cord 60 from contacting the rack 70 during installation and while being stored with the rack, and preventing the at least one power cord 60 from becoming pinched between the respective first or second side portion 18, 20 of the chassis 10 and the posts 72 and/or side panels 74 (or any other portion) of the rack 70. As noted above, however, the rack 70 may be any electronic equipment rack 70 of any design, and the chassis 10 may include one or more power couplers 40 (positioned in one or more recessed portions 28) and associated one or more power cords 60 on the first and/or second side portions 18, 20 of housing 12. The at least one cord support mechanism 32 may thus be configured to suit a particular electronic equipment rack (i.e., in a different configuration than illustrated herein) such that the at least one power cord 60 is prevented from interfering with, or becoming damaged, during installation, storage and/or use with the particular electronic equipment rack.

It is to be understood that the above description is intended to be illustrative, and not restrictive. Numerous changes and modifications may be made herein by one of ordinary skill in the art without departing from the general spirit and scope of the inventions as defined by the following claims and the equivalents thereof. For example, the above-described embodiments (and/or aspects thereof) may be used in combination with each other. In addition, many modifications may be made to adapt a particular situation or material to the teachings of the various embodiments without departing from their scope. Any dimensions and types of materials described herein are intended to define the parameters of the various embodiments, but they are by no means limiting and are merely exemplary. Many other embodiments will be apparent to those of skill in the art upon reviewing the above description. The scope of the various embodiments should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Also, the term "operably connected" is used herein to refer to both connections resulting from separate, distinct components being directly or indirectly coupled and components being integrally formed (i.e., monolithic). Further, the limitations of the following claims are not written in means-plus-function format and are not intended to be interpreted based on 35 U.S.C. § 112, sixth paragraph, unless and until such claim limitations expressly use the phrase "means for" followed by a statement of function void of further structure. It is to be understood that not necessarily all such objects or advantages described above may be achieved in accordance with any particular embodiment. Thus, for example, those skilled in the art will recognize that the systems and techniques described herein may be embodied or carried out in a manner that achieves or optimizes one advantage or group of advantages as taught herein without necessarily achieving other objects or advantages as may be taught or suggested herein.

While the inventions have been described in detail in connection with only a limited number of embodiments, it should be readily understood that the inventions are not limited to such disclosed embodiments. Rather, the inventions can be modified to incorporate any number of variations, alterations, substitutions or equivalent arrangements not heretofore described, but which are commensurate with the spirit and scope of the inventions. Additionally, while various embodiments of the inventions have been described, it is to be understood that aspects of the disclosure may include only some of the described embodiments. Further, any of the embodiments described herein are not meant to be limiting, and any features or combination of features of the differing embodiments described herein that could or would be implemented by one of ordinary skill in the art in any another embodiment should be recognized and is hereby contemplated. Accordingly, the inventions are not to be seen as limited by the foregoing description, but is only limited by the scope of the appended claims.

This written description uses examples to disclose the inventions, including the best mode, and also to enable any person skilled in the art to practice the inventions, including making and using any devices or systems and performing any incorporated methods. The patentable scope of the inventions is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

We claim:

1. A rack-mount chassis for mounting to an electronic equipment rack, comprising:
   a housing comprising a top portion, a bottom portion, a first side portion, a second side portion and a back portion;
   a front panel forming a front face of the housing including portions that protrude past the first and second side portions configured to couple to front posts of the electronic equipment rack with the housing positioned within the rack;
   at least one electronic component within the housing; and
   at least one electrical power coupler mounted to at least one recessed portion of the first side portion of the housing configured to mate with a corresponding connector plug of a power cord and supply electrical power therefrom to the at least one electronic component,
   wherein the first side portion, the second side portion, the at least one recessed portion and the at least one electrical power coupler are exposed to an interior of the electronic equipment rack when the housing is positioned within the electronic equipment rack.

2. The rack-mount chassis according to claim 1, further comprising at least one internal power supply unit positioned within the housing and electrically coupled between the at least one electrical power coupler and the at least one electronic component.

3. The rack-mount chassis according to claim 1, wherein the at least one recessed portion and the at least one electrical power coupler are spaced from the back portion towards the front panel.

4. The rack-mount chassis according to claim 1, wherein the first side portion extends between the top and bottom portions, the back portion and the front panel.

5. The rack-mount chassis according to claim 1, wherein the first side portion includes at least one cord support mechanism extending outwardly therefrom positioned between the back portion and the at least one electrical power coupler configured to route the power cord along the first side portion and past the back portion.

6. The rack-mount chassis according to claim 5, wherein the at least one cord support mechanism forms a channel with the first side portion that supports and prohibits movement the power cord.

7. The rack-mount chassis according to claim 5, wherein the at least one cord support mechanism includes an outer portion that prevents the contact of the power cord with the electronic equipment rack.

8. The rack-mount chassis according to claim 1, further comprising the power cord.

9. The rack-mount chassis according to claim 1, wherein the at least one electrical power coupler extends through an aperture in the at least one recessed portion of the first side portion.

10. The rack-mount chassis according to claim 1, comprising a plurality of the electrical power couplers mounted to at least one recessed portion of the first side portion of the housing.

11. The rack-mount chassis according to claim 1, further comprising at least one electrical power coupler mounted to at least one recessed portion of the second side portion of the housing configured to mate with a corresponding connector plug of a power cord and supply electrical power therefrom to the at least one electronic component.

12. The rack-mount chassis according to claim 11, comprising a plurality of the electrical power couplers mounted to at least one recessed portion of the second side portion of the housing.

13. The rack-mount chassis according to claim 1, wherein the back portion of the housing is void of an electrical power coupler.

14. The rack-mount chassis according to claim 1, wherein the back portion of the housing includes at least one input and/or output connector.

15. The rack-mount chassis according to claim 1, wherein the front panel is configured to fixedly couple to the front posts of the electronic equipment rack with the housing positioned within the rack such that the housing is fixedly coupled to the electronic equipment rack.

16. The rack-mount chassis according to claim 1, wherein inner surfaces of the top portion, the bottom portion, the first side portion, the second side portion and the back portion of the housing define an interior cavity of the housing, and wherein the at least one electronic component and the at least one recessed portion are positioned within the interior cavity.

17. A rack-mount chassis for mounting to an electronic equipment rack, comprising:
   a housing comprising a top portion, a bottom portion, a first side portion, a second side portion and a back portion, the housing configured to house at least one electronic component; and
   a front portion forming a front face of the housing,
   wherein at least the first side portion of the housing includes at least one recessed portion configured to couple with at least one electrical power coupler, and
   wherein the first side portion, the second side portion, the at least one recessed portion and the at least one electrical power coupler are exposed to an interior of the electronic equipment rack when the housing is positioned within the electronic equipment rack.

18. The rack-mount chassis according to claim 17, further comprising the at least one electrical power coupler coupled within the at least one recessed portion.

19. The rack-mount chassis according to claim 18, further comprising at least one electronic component within the housing configured to receive electrical power from the at least one electrical power coupler.

20. The rack-mount chassis according to claim 17, wherein the at least one electrical power coupler is configured to mate with a corresponding connector plug of a power cord to receive electrical power therefrom.

21. The rack-mount chassis according to claim 17, wherein the first side portion includes at least one cord support mechanism extending outwardly therefrom positioned between the back portion and the at least one recessed portion configured to route a power cord from the at least one recessed portion, along the first side portion and past the back portion.

22. The rack-mount chassis according to claim 17, wherein the back portion of the housing is void of an electrical power coupler.

* * * * *